(12) United States Patent
Mueller

(10) Patent No.: US 8,233,336 B2
(45) Date of Patent: Jul. 31, 2012

(54) MEMORY CONTROLLER COMPRISING ADJUSTABLE TRANSMITTER IMPEDANCE

(75) Inventor: Christian Mueller, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 115 days.

(21) Appl. No.: 12/567,650

(22) Filed: Sep. 25, 2009

(65) Prior Publication Data

US 2011/0075496 A1    Mar. 31, 2011

(51) Int. Cl.
*G11C 7/00* (2006.01)
(52) U.S. Cl. .... 365/193; 365/191; 365/201; 365/189.07
(58) Field of Classification Search .................. 365/193, 365/191, 201, 189.07
See application file for complete search history.

(56) References Cited

U.S. PATENT DOCUMENTS

| | | | |
|---|---|---|---|
| 5,548,821 A * | 8/1996 | Coveley | 455/67.14 |
| 6,724,890 B1 | 4/2004 | Bareis | |
| 2002/0173926 A1 | 11/2002 | McCord | |
| 2008/0123771 A1 * | 5/2008 | Cranford et al. | 375/285 |

FOREIGN PATENT DOCUMENTS

WO    WO2004/061689 A2    7/2004

* cited by examiner

*Primary Examiner* — Hoai V Ho
*Assistant Examiner* — Kretelia Graham
(74) *Attorney, Agent, or Firm* — Lee & Hayes, PLLC

(57) ABSTRACT

Memory controllers, memory devices and methods are provided in which test data is transmitted and signal parameters are varied. The transmitted test data is read, and based on a comparison between transmitted test data and read test data a transmitter impedance is adjusted.

9 Claims, 6 Drawing Sheets

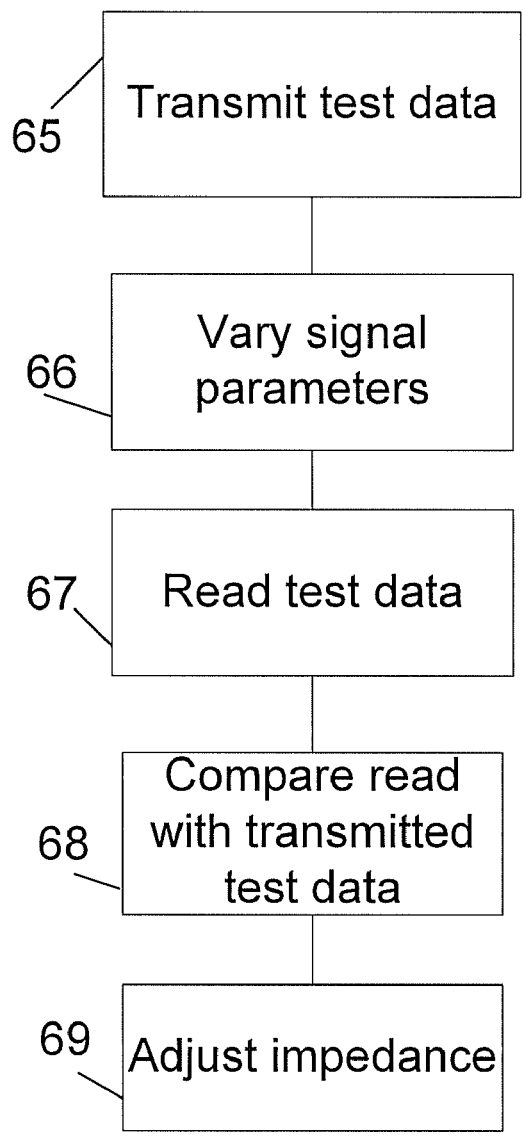
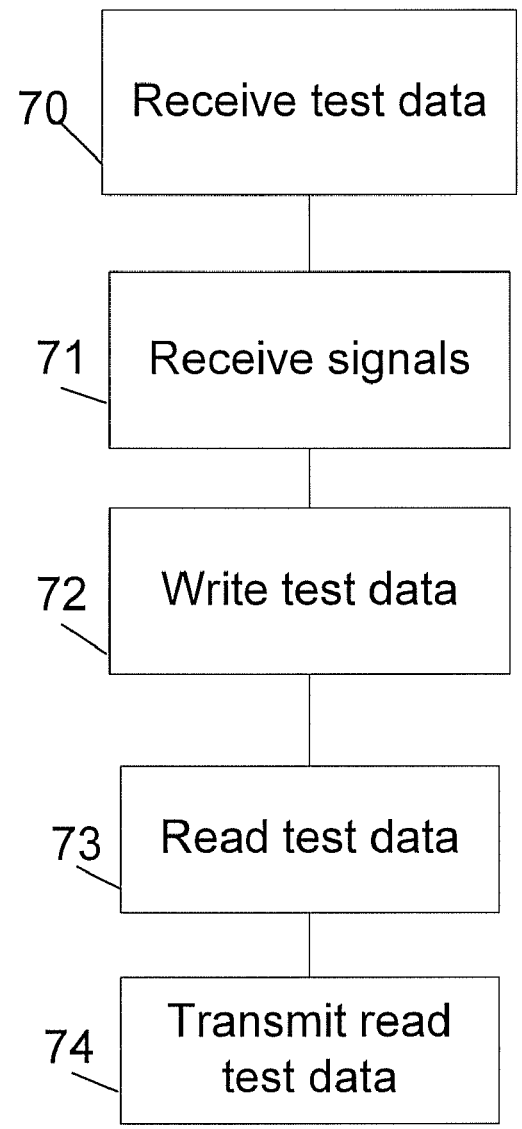
Fig. 6
Fig. 7

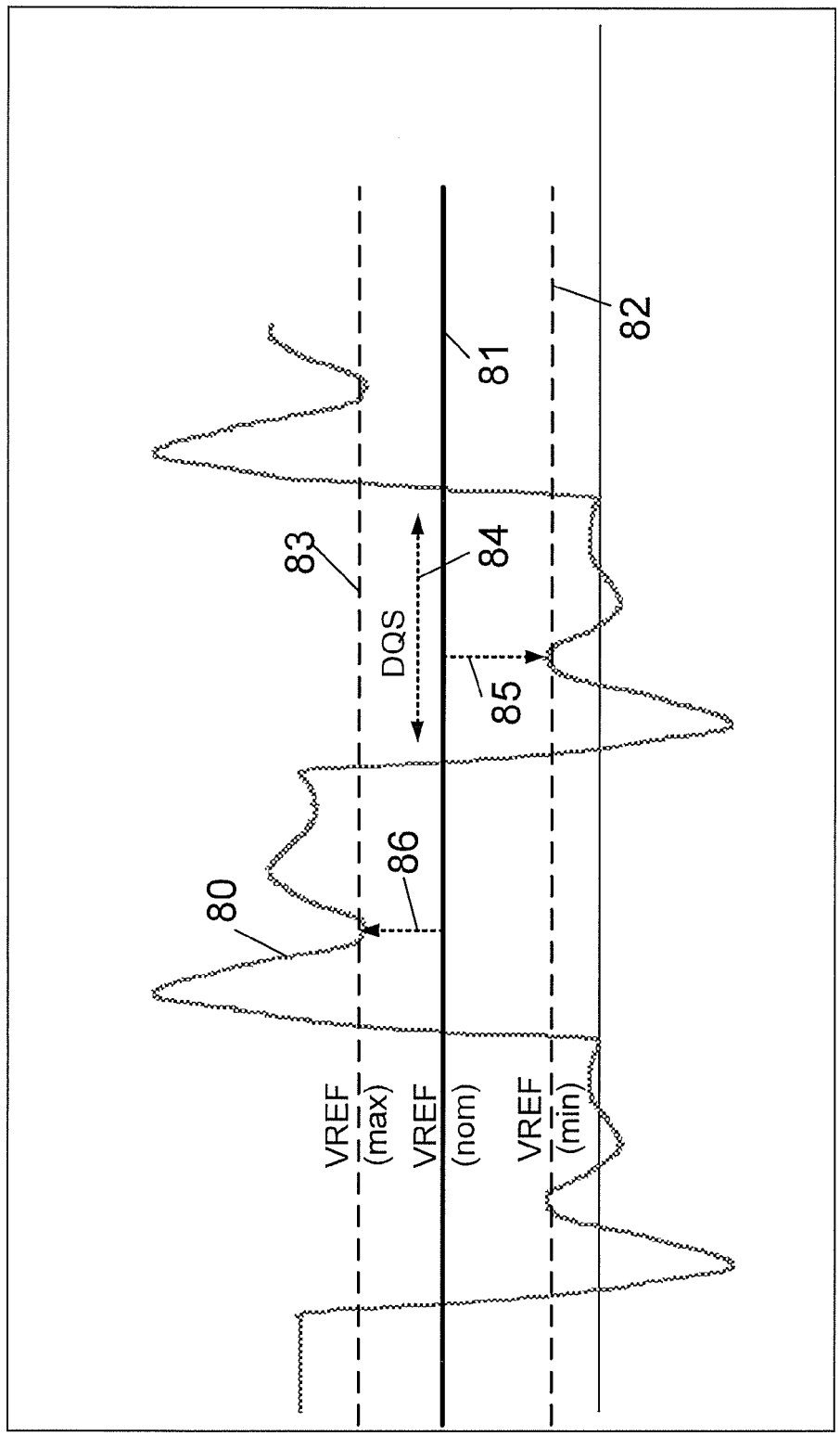

MEMORY CONTROLLER COMPRISING ADJUSTABLE TRANSMITTER IMPEDANCE

BACKGROUND

The present invention relates to memory controllers or memory components comprising an adjustable transmitter impedance, memory arrangements comprising such memory controllers and corresponding methods.

In memory arrangements, usually a memory controller communicates with one or more memory components, for example memory chips. As an example, if data is to be written to the memory arrangement, the memory controller receives a corresponding write request, for example from a microprocessor, and then sends a write command together with the data to be written to one or more of the memory components. To achieve this, one or more communication lines, for example connections on a printed circuit board, need to be provided between the memory controller and the memory components.

In case a transmitter impedance of a transmitter of the memory controller sending data and/or commands is not correctly matched with an impedance of the communication lines, reflections may occur which distort the signal form at a receiver in the memory components and which may lead to incorrect writing of data.

Therefore, in some systems a variable transmitter impedance is provided at the transmitter which is calibrated using for example an external precise reference resistor. To be able to couple the reference resistor with the variable transmitter impedance, a dedicated pin of a package of the memory controller is conventionally necessary, which is undesirable due to cost and space restraints.

A different approach is to measure the transmitter impedance during a production test and to provide a correction value for each memory controller manufactured, which may be written into a non-volatile memory of the memory controller, for example a so-called eFuse. Such eFuse requires silicon area and testing time during the production test, both of which is also not desirable.

SUMMARY

According to an embodiment, a memory controller is provided, comprising:
 a transmitter configured to transmit data to at least one memory component, said transmitter comprising an adjustable impedance, and
 said memory controller being configured to transmit test data to said at least one memory component, to vary at least one signal parameter of signals transmitted to said at least one memory component during said transmitting of said test data, to read said test data from said memory component, to compare the read test data with the transmitted test data and to adjust the adjustable impedance based on the result of the comparison.

It should be noted that the above summary is only intended to provide an abbreviated overview over some features of some embodiments of the present invention, and the present invention is not limited to these features, as different embodiments may comprise different features.

BRIEF DESCRIPTION OF THE SEVERAL VIEWS OF THE DRAWINGS

FIG. 6 shows a flow diagram of a method according to an embodiment.

FIG. 7 shows a flow diagram of a method according to an embodiment.

FIG. 8 shows an example for a signal for explaining some features of some embodiments.

DETAILED DESCRIPTION OF THE INVENTION

Figure 1:
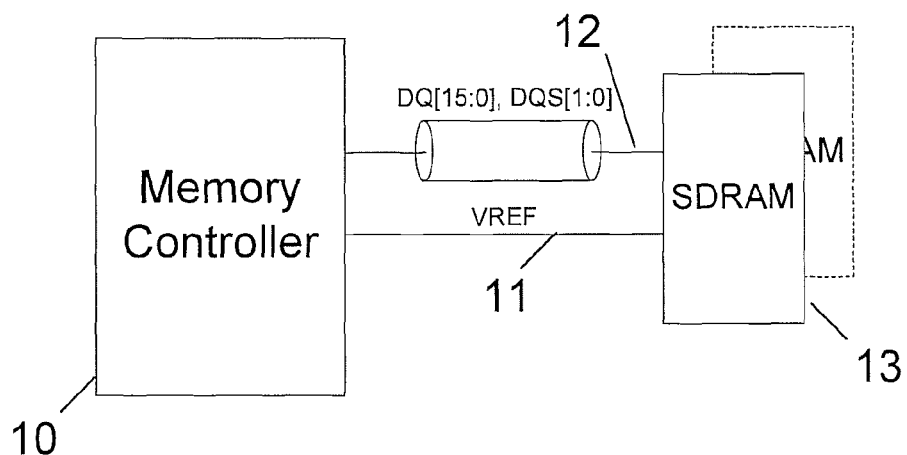
FIG. 1 shows a block diagram of a memory arrangement according to an embodiment.

In the following, some embodiments of the present invention will be described in detail. It is to be understood that the following description is given only for the purpose of illustration and is not to be taken in a limiting sense. The scope of the invention is not intended to be limited by the embodiments described hereinafter with reference to the accompanying drawings, but is intended to be limited only by the appended claims and equivalents thereof.

It is also to be understood that in the following description of embodiments any direct connection or coupling between functional blocks, devices, components, circuit elements or other physical or functional units shown in the drawings or described herein could also be implemented by an indirect connection or coupling, i.e. a connection or coupling comprising one or more intervening elements. Furthermore, it should be appreciated that functional blocks or units shown in the drawings may be implemented as separate circuits in some embodiments, but may also be fully or partially implemented in a common circuit in other embodiments. It is further to be understood that any connection which is described as being wire-based in the following specification may also be implemented as a wireless communication unless noted to the contrary.

It should be noted that the drawings are provided to give an illustration of some aspects of embodiments of the present invention and therefore are to be regarded as schematic only. In particular, the elements shown in the drawings are not necessarily to scale with each other, and the placement of various elements in the drawings is chosen to provided a clear understanding of the respective embodiment and is not to be construed as necessarily being a representation of the actual relative location of the various components in implementations according to an embodiment of the invention.

The features of the various embodiments describe herein may be combined with each other unless specifically noted otherwise. On the other hand, describing an embodiment with a plurality of features is not to be construed as indicating that all those features are necessary for practicing the present invention, as other embodiments may comprise less features and/or alternative features.

In some of the following embodiments, memory arrangements will be described. In the context of the present invention, memory arrangements generally comprise a memory controller and one or more memory components, for example memory chips. The memory controller generally receives read requests or write requests from circuitry external to the memory arrangements and performs corresponding read or write accesses to the memory components. Memory controllers and memory components are also generically referred to as memory devices herein.

Turning now to the figures, in FIG. 1 a memory arrangement according to an embodiment of the present invention is shown. The memory arrangement of the embodiment of FIG. 1 comprises a memory controller 10 and one or more memory components 13, which in the case of FIG. 1 are SDRAM components. However, it is to be understood that the present invention is not limited to SDRAM components, but any memory components like other DRAM types may be employed, for example graphic DRAMs.

In the embodiment of FIG. 1, memory controller 10 transmits a reference voltage VREF via a line 11, and data signals DQ as well as a data strobe signal DQS via lines 12. Lines 11, 12 may be connections on a printed circuit board. In FIG. 1 the situation for write operations is shown, i.e. when memory controller 10 transmits data to the SDRAM for writing. In the embodiment shown, the same lines may also be used for reading data from the SDRAM. In other embodiments, additional lines may be provided for reading data. Additionally, lines for further purposes, e.g. control lines or one or more lines for so-called data mask signals, may be present.

In the embodiment of FIG. 1, 16 lines or 16 bits are transmitted in parallel numbered 15-0, while in other embodiments any other number of parallel bit lines may be provided. The data strobe signal is a clock signal which is in the memory components 13 then used for sampling the data signals DQ. In the embodiment of FIG. 1, the data strobe signal is a differential digital 2-bit signal, i.e. when one of the bits assumes a logic one, the other assumes a logic zero. In other embodiments, the data strobe signal may be single-ended, e.g. a 1-bit signal.

Figure 2:
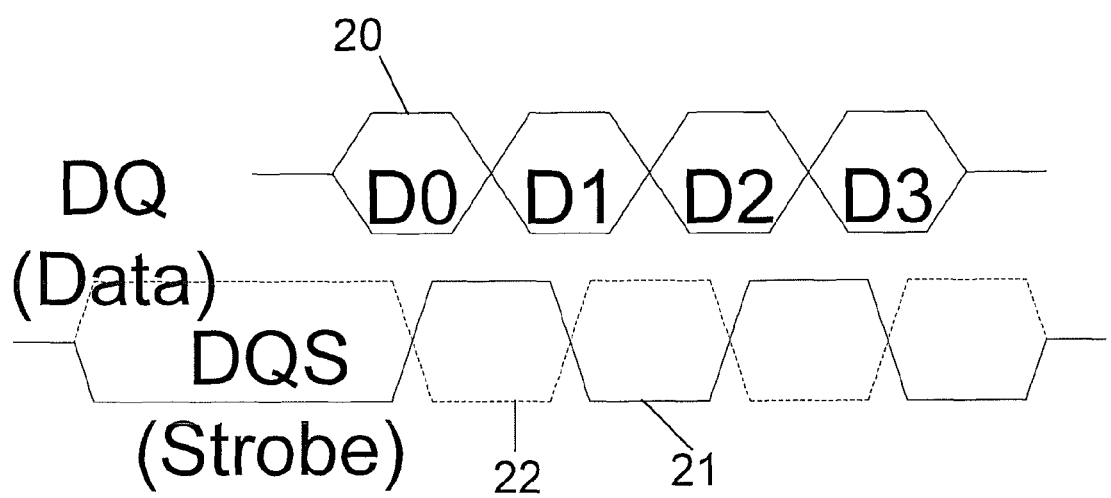
FIG. 2 shows examples for signals in the embodiment of FIG. 1.

For an ideal case, a single data signal 20 and a data strobe signal 21, 22 are shown in FIG. 2. In this case, the data signal is a so-called single ended signal which, as indicated in FIG. 2, may assume two different states. In FIG. 2, the transmission of 4 consecutive bits D0-D3 is shown, wherein each bit either may assume a first state corresponding to the upper level of signal 20 or a second state corresponding to the lower level of signal 20 shown in FIG. 2. For example, the first state may be associated with a logic one, and the second state may be associated with a logic zero. Any sequence of logic ones and logic zeros may be transmitted in this way.

The strobe signal DQS in the embodiment of FIG. 2 is a differential signal with part signals 21, 22 wherein part signal 22 is the inverted part signal 21. At changes of the state of the strobe signal, i.e. when the strobe signal 21, 22 changes between the two states shown, the data signal 20 is sampled, for example compared to the reference voltage VREF of FIG. 1 using a comparator as will be described later in some more detail. It should be noted that in some embodiments sampling may only occur at state changes in one direction, for example when part signal 21 changes from 0 to 1, whereas in other embodiments sampling may occur at all transitions, as shown in FIG. 2.

As shown in FIG. 2, in an ideal case the state changes of the strobe signal are in the middle of each data portion D0, D1, D2, D3 to ensure a good sampling timing. However, some deviations from this ideal case are possible and still ensure correct data sampling.

As already mentioned, FIG. 2 shows basically ideal signal forms. The signals shown in FIG. 2 are transmitted by a transmitter of memory controller 10 via lines 12 to a receiver in memory components 13.

Figure 3:
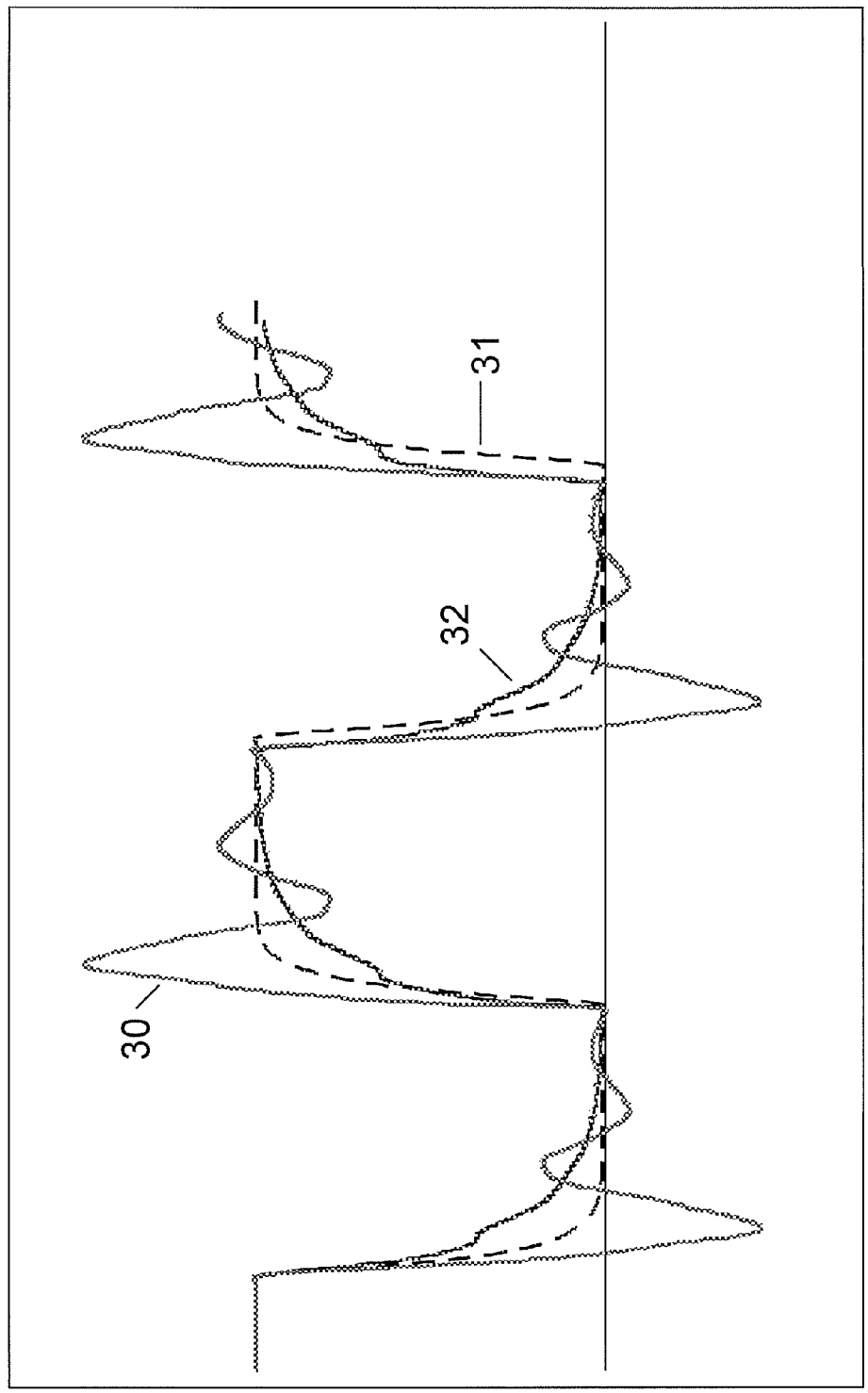
FIG. 3 shows examples for signals for different values of a transmitter impedance.

In case of a mismatch between an impedance of such a transmitter of memory controller 10 and an impedance of lines 12, for example due to a lack of termination of lines 12, reflections occur depending on the relation of the impedance of the transmitter to the impedance of the lines. Such different signal forms are schematically shown in FIG. 3, FIG. 3 showing examples for signals at an input of a receiver in a memory component, i.e. at the so-called far end of the line.

A curve 31 shows a signal in case the transmitter impedance is approximately equal to the line impedance. A curve shows a case where the transmitter impedance is significantly smaller than the line impedance, which leads to reflections of the signal occurring, which reflections are visible as "overshoot" and "undershoot" in the signals as shown in FIG. 3. Finally, curve 32 shows a case where the transmitter impedance is considerably greater than the line impedance, in which case the states (plateaus) of the signal are only reached slowly.

Overshoot and undershoot as shown in curve 30 may lead to a wrong interpretation of the data by the receiver, for example a logic one being sampled as a zero and vice versa. The reduced edge steepness of the signal as in curve 32 may adversely affect so-called setup and hold margins.

Therefore, in embodiments of the invention as will be explained below in more detail an adjustable impedance is provided in the transmitter which is adjusted to limit the effects visible in curve 30 and curve 32. It is to be noted that in many cases an exact impedance matching leading to curve 31 is not necessary, but it is sufficient to limit the effect discussed above enough such that predetermined specifications, i.e. requirements to the signal quality, are fulfilled. In order to adjust the adjustable impedance, in an embodiment of the present invention measurements are carried out by transmitting predetermined test data from a memory controller like memory controller 10 to one or more memory components like memory component 13, to vary one or more signal parameters in the data transmission and to re-read the test data from the memory component. Based on the transmitted and read test data the impedance is adjusted. This in the following will be explained in more detail with reference to FIGS. 4-8.

Figure 4:
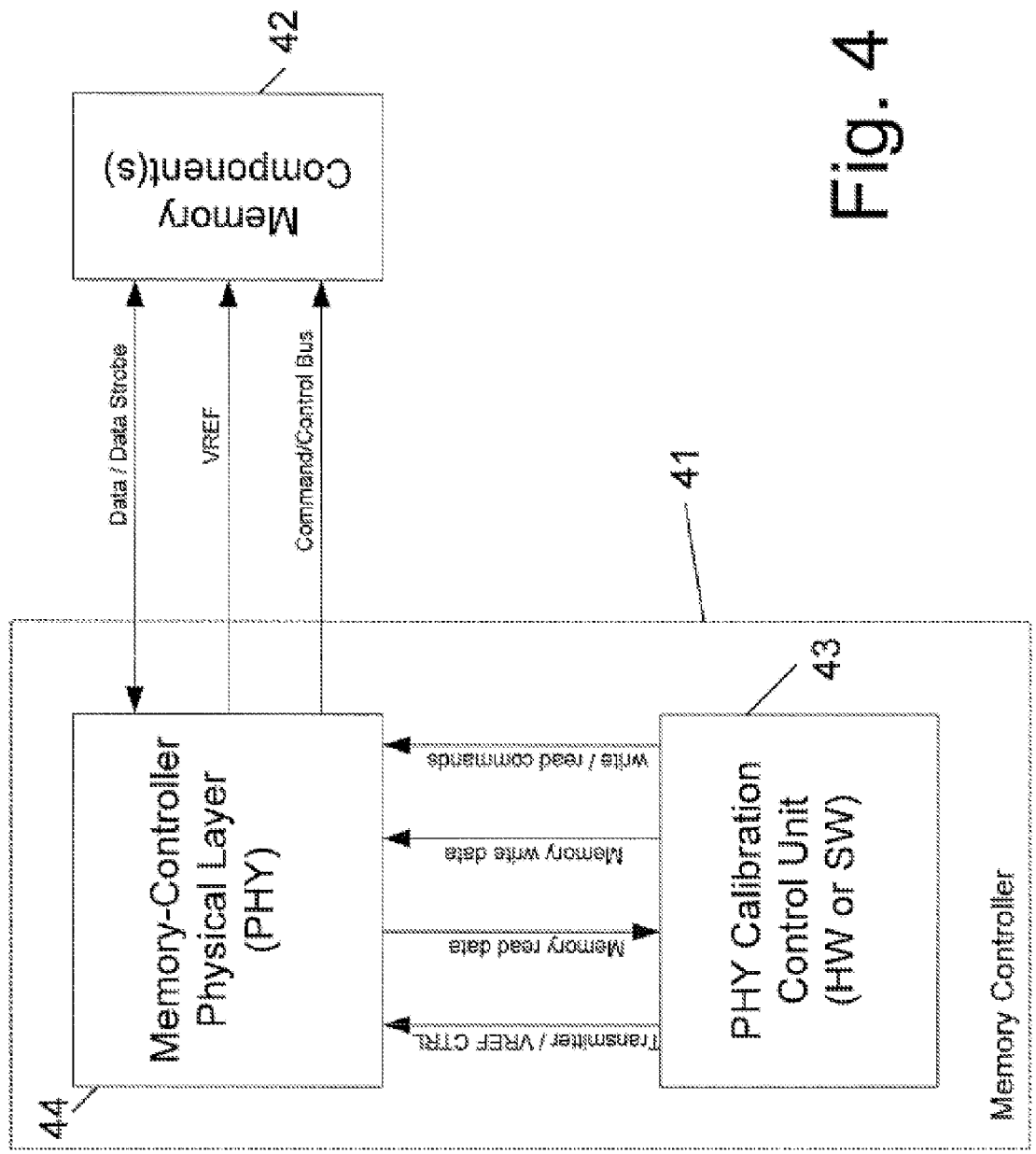
FIG. 4 shows a block diagram of a memory arrangement according to an embodiment.
Figure 5:
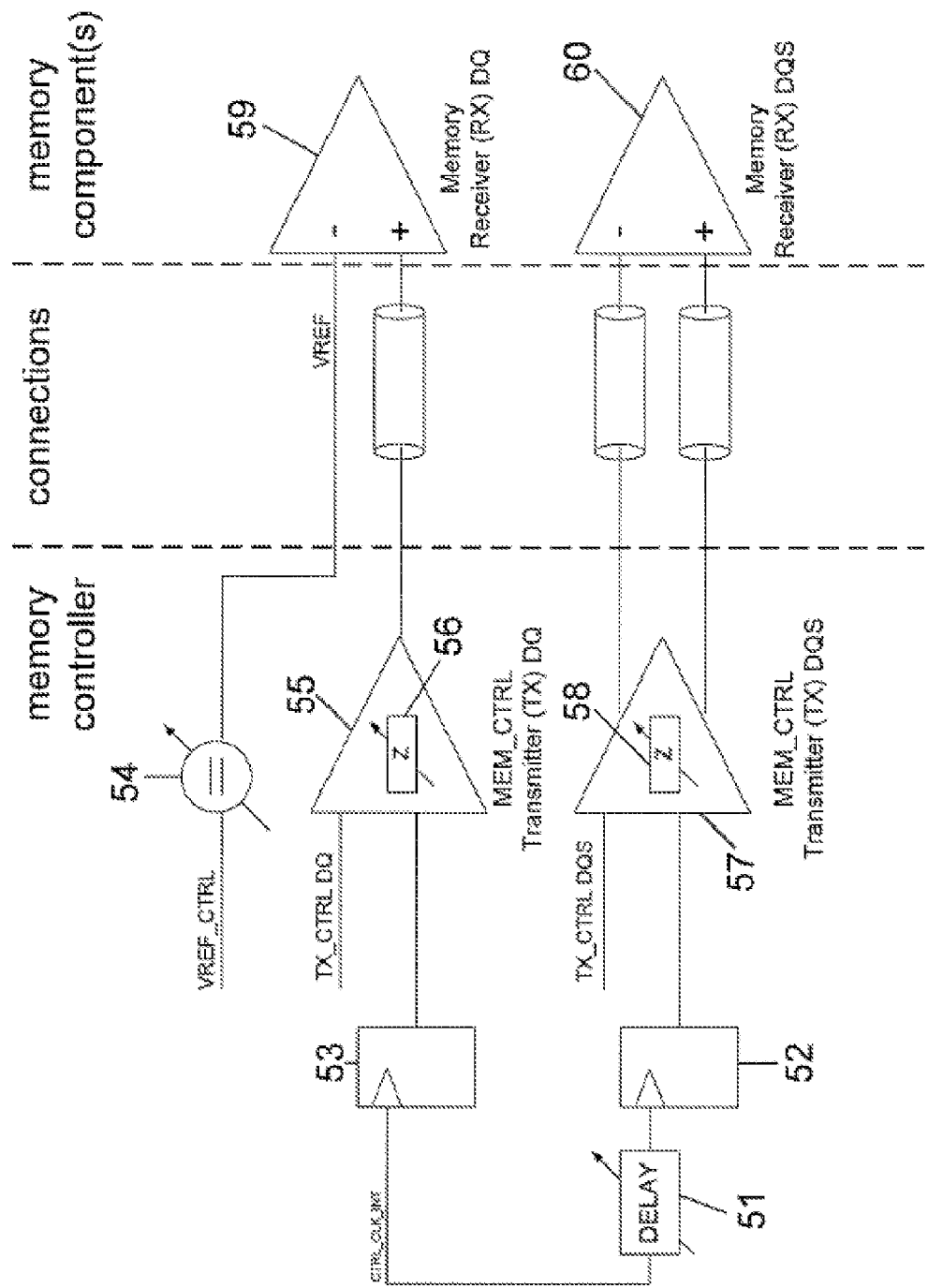
FIG. 5 shows a circuit diagram of some elements of a memory arrangement according to an embodiment.

In FIG. 4, a block diagram of a memory arrangement of an embodiment of the present invention is shown. In FIG. 5, a circuit diagram of some components of a memory arrangement according to an embodiment is shown. The components shown in FIG. 5 may be implemented in the memory arrangement of FIG. 1 or the memory arrangement of FIG. 4, but may also be implemented in other memory arrangements.

The memory arrangement of FIG. 4 comprises a memory controller 41 and one or more memory components 42, for example DRAM chips, SDRAM chips or other memory chips.

Memory controller 41 comprises a memory controller physical layer 44, i.e. the physical components of the memory controller some examples for which will be discussed later with reference to FIG. 5. Memory controller physical layer 44 transmits data and data strobe signals to memory component(s) 42 for write operations and receives data and data strobe signals from memory component(s) for read operations, as already explained with reference to FIGS. 1 and 2.

Furthermore, as also explained already with reference to FIG. 1, memory controller physical layer 44 transmits a reference voltage VREF to memory component(s) 42. Finally, a command/control bus is provided in the embodiment of FIG. 4 for transmitting specific commands from memory controller 41, in particular memory controller physical layer 44 thereof, to memory component(s) 42.

Memory controller physical layer 44 comprises one or more transmitters for transmitting the above-mentioned data and data strobe signals to memory component(s) 42, said transmitters having a adjustable impedance. For performing an adjustment or calibration of this adjustable impedance, in memory controller 41 a physical calibration control unit 43 is provided, which may for example be implemented in hardware or software or a combination thereof.

Physical calibration control unit 43 communicates with memory controller physical layer 44 to perform a calibration of an adjustable transmitter impedance. Physical calibration control unit 43 as indicated in FIG. 4 may cause memory controller physical layer 44 to write data, e.g. test data, to memory component(s) 42 by transmitting data to be written along with a write command to memory controller physical layer 44 or cause memory controller physical layer 44 to read data from memory component(s) 42 by issuing a read command to memory controller physical layer 44 and to receive read data therefrom. Finally, physical calibration control unit 43 may cause memory controller physical layer 44 to change the transmitter impedance, to change the transmitted reference voltage VREF or also to change a timing of the data strobe signal in the embodiment of FIG. 4. In different embodiments, alternatively or additionally the amplitude of the data signal may be controlled.

By writing test data to memory component(s) 42 with varying signal parameters, for example varying VREF or varying data strobe timing, and then reading this test data again, information regarding the signal quality may be obtained, and the transmitter impedance may be adjusted to improve the signal quality. Before discussing examples for this calibration procedure in some more detail, first with reference to FIG. 5 some components of a memory controller and memory component(s), for example memory controller physical layer 44 of memory controller 41 and memory component(s) 42 of FIG. 4, will be explained with reference to FIG. 5.

In FIG. 5, on the left side some components of a memory controller, in particular a physical layer, are depicted, on the right side some components of memory component(s) are depicted, and therebetween the connections, which for example may be connections on a printed circuit board, are shown. It should be noted that the arrangement in FIG. 5 is merely for ease of representation and is not to be construed as limiting the positions of the various components shown.

The components of the memory controller shown in FIG. 5 comprise an adjustable voltage source 54 for generating a reference voltage VREF. The adjustable voltage source 54 is controlled by a signal VREF_CTRL.

Furthermore, the components of the memory controller comprise a transmitter 55 for transmitting a data signal DQ and a transmitter 57 for transmitting a strobe signal DQS. It should be noted that transmitter 55 may comprise a plurality of transmitters, if a plurality of data signals DQ are transmitted in parallel, for example a plurality of bits. Additional transmitters (not shown) may be provided to transmit additional signals, e.g. the above-mentioned data mask signals.

Transmitter 55 comprises a variable impedance 56 controlled, i.e. adjustable, by a signal TX_CTRL DQ, and transmitter 57 comprises a variable impedance 58 which is controlled, i.e. adjustable, by a signal TX_CTRL DQS. The control signals VREF_CTRL, TX_CTRL DQ and TX_CTRL DQS may for example be generated by physical calibration control unit 43 of FIG. 4 during a calibration procedure for calibrating impedances 56, 58.

Transmitter 55 receives data to be transmitted via a latch 53, and transmitter 57 receives the strobe signal to be transmitted via a latch 52. Latches 52, 53 are controlled by a clock signal CTRL_CLK_INT, which is directly supplied to a clock input of latch 53 and which is supplied to a clock input of latch 52 via a delay 51, which for example may be a delay locked loop (DLL). Via delay 51, the strobe signal transmitted by transmitter 57 may be delayed, i.e. shifted in time.

In the embodiment of FIG. 5, transmitter 55 is a single ended transmitter, whereas transmitter 57 is a differential transmitter for transmitting the data strobe signal differentially. In other embodiments, also transmitter 57 may be a single-ended transmitter, and/or transmitter 55 may be a differential transmitter.

On the side of the memory component(s), a memory receiver 59 which is in the embodiment of FIG. 5 implemented as a comparator receives the data signal DQ and compares it with the reference voltage VREF. In case the data signal is above the reference voltage by a predetermined threshold, a state corresponding to a logic one is output, and if the data signal is below the reference voltage VREF by a predetermined threshold, a state corresponding to a logic zero is output by memory receiver 59 in the embodiment shown. In case the data signal is closer to the reference voltage VREF than the above-mentioned predetermined thresholds, either a logic one or a logic zero is output depending on factors like the circuit concept, edge times of the signal, stability of the signal reference voltage VREF etc. In other words, in order to ensure a correct receipt of the data, the above-mentioned thresholds should be exceeded in the embodiment shown.

In a differential receiver 60, the data strobe signal DQS is received. The output of memory receiver 59 is then for example sampled with the strobe signal to recover the transmitted data.

In the embodiment of FIG. 5, the impedance 58 is adjusted in the same way as the impedance 56, such that the two impedances have essentially the same values. In other embodiments, the impedances may be adjusted to different values.

Next, embodiments of the already mentioned calibration of the transmitter impedance of a memory controller, for example transmitter impedance 56 and 58 of FIG. 5, will be explained in more detail. In FIG. 6, a flow diagram of a method according to an embodiment which may be implemented in a memory controller is shown, in FIG. 7 the flow diagram of a corresponding method which may be implemented in one or more memory components is shown, and in FIG. 8 a signal diagram is shown for explaining some aspects and features of the embodiments of FIGS. 6 and 7. As the methods of FIGS. 6 and 7 involve an interaction between them, e.g. via signals transmitted between memory controller and memory component, the methods will be described jointly below.

It should be noted that in FIGS. 6 and 7, the various actions and operations need not necessarily be executed in the shown order.

At 65 in FIG. 6, a memory controller transmits test data to a memory component. The test data for example may be alternating values of logic one and logic zero, but is not restricted thereto and essentially can be any series of logic one and logic zero. In an embodiment, transitions from logic one to logic zero and vice versa are included in the test data in regular or irregular intervals.

At 66, one or more signal parameters of one or more signal(s) transmitted to the memory component are varied. For example, a reference voltage may be varied, or a delay of a data strobe signal may be varied. It should be noted that the operations explained with reference to 65 and 66 in FIG. 6 may be executed essentially simultaneously. Another signal parameter which may be varied in an embodiment is the amplitude of the test data.

Correspondingly, as shown in FIG. 7, at a memory component at 70 test data transmitted by a memory controller is received, and at 71 additional signals, for example a reference voltage or a data strobe signal, are received. Again, the operations described with respect to 70 and 71 may be executed essentially simultaneously. At 72, the received and recovered test data is written to the memory.

At 67, the memory controller sends a read request to retrieve the test data written to the memory. Correspondingly, at 73 the memory component reads the test data from the memory and transmits it to the memory controller at 74.

At 68, the memory controller compares the read test data with the transmitted test data. Depending on this comparison, at 69 the transmitter impedance is adjusted.

It should be noted that the operations described with respect to 65-68 and the corresponding operations 70-74 may be performed a plurality of times before adjusting the transmitter impedance. Moreover, after adjusting the transmitter impedance, the methods may be started anew until for example the comparison at 68 indicates that predetermined requirements, for example requirements according to a specification, are met.

Examples for the operations described with respect to FIGS. 6 and 7, in particular the varying of signal parameters at 66 of FIG. 6, will now be described with reference to FIG. 8. However, it is to be noted that the situation shown in FIG. 8 serves merely as an example for explaining possible features of some embodiments, and the present invention is not limited thereto.

As an example, in an embodiment the transmitter impedance is, at the beginning of the method shown in FIGS. 6 and 7, set to its lowest possible value. As already explained with reference to FIG. 3, a transmitter impedance value considerably smaller than an impedance of a connection between memory controller and memory components, for example a connection on a printed circuit board, leads to signal reflections as in a signal 80 shown in FIG. 8 as an example. Signal 80 in FIG. 8 corresponds for example to test data with alternating values of logic zero and logic one.

In addition, in FIG. 8 a nominal value of the reference value VREF is shown as a line 81. When the curve 80 is below VREF for example a comparator like memory receiver 59 of FIG. 5 outputs a logic zero, whereas when curve 80 is above VREF a logic one is output.

By varying the delay of a data strobe signal DQS as indicated by an arrow 84, the time when the data is sampled can be adjusted. In this way, the horizontal size of the so-called data eye for a specific value of VREF can be measured, i.e. the delay is increased and decreased until an incorrect value is written to the memory or, in other words, the comparison at 68 of FIG. 6 indicates a mismatch between transmitted test data and read test data. In an embodiment, at first VREF is set to its nominal value, i.e. the value of line 81, and data is written to the memory and read out again. The data strobe signal is then varied as explained above to determine the width of the data eyes, i.e. the delay is adjusted until the read out data does not match with the test data transmitted to the memory.

Then, in an embodiment the reference voltage VREF is increased stepwise, and after each increase the delay for the data strobe signal is varied again, until a significant reduction of the width of the data eye, for example a reduction exceeding a predetermined threshold, is found. In the example curve 80 of FIG. 8, this corresponds to the voltage VREF (Max) as indicated by line 83, when the reflection indicated with an arrow 86 reduces the width of the data eye.

In a next step, the delay is then set to the position indicated by arrow 86. VREF is then further increased and a part of the transmitter impedance used for generating a logic one, also referred to as pullup impedance, is adjusted to reduce the reflection.

In an embodiment, this is repeated until VREF has reached a predetermined value. In another embodiment, this may be repeated until no improvement of the reflection is possible. In a further embodiment, after this adjusting of the transmitter impedance, VREF is set to the nominal value and the width of the data eye is checked again, and if it has decreased below a predetermined threshold, the transmitter impedance is again adjusted to increase the width of the data eye (as can be seen from curve 32 of FIG. 3, increasing the transmitter impedance overly may lead to reduced edge deepness and therefore to a reduced data eye width.

In some embodiments, depending on the comparator used in the receiver is able to use data and VREF signals over the complete supply voltage range. Such receivers are also referred to as rail to rail receivers. In this case, the same procedure may be repeated for an impedance used for generating the logic zero value, also referred to as pull down impedance, which in the example of FIG. 8 would lead to reduction of the reflection indicated by an arrow 85 corresponding to a value VREF (min) as indicated by a dashed line 82.

In other embodiments, a receiver in a memory component is only adapted to perform the calibration of the portion of the transmitter impedance for the state of logic one or high state, i.e. the pullup impedance. In still other embodiments, a receiver may only allow the calibration of a pulldown impedance, i.e. in FIG. 8 the reduction of the reflection indicated by arrow 85. In case only the pullup impedance or only the pulldown impedance can be adjusted in the above-explained manner, in an embodiment the respective other impedance is adjusted within the memory controller. In an embodiment, a transmitter like transmitter 55 of FIG. 5 to achieve this is set to output both high and low signal, i.e. both logic one and logic zero, simultaneously, and the non-calibrated impedance (i.e. the impedance not calibrated by the method above) is adjusted until an internal data receiver, for example a data receiver used for receiving data from the memory components, detects a crossing of VREF, VREF being set to its nominal values. In such a case, the transmitter essentially acts as a voltage divider, and when both impedances have the same value the output voltage in this case is between the voltage for logic zero and the voltage for logic one.

In an embodiment, in cases where it is not known which kind of memory component receiver is used, the type of receiver is determined prior to performing the calibration. This may be done with a method using the same principles as explained with reference to FIGS. 6-8, i.e. transmitting test data, reading the test data again and varying the reference voltage. In this case, test data is used where the changes from logic one to logic zero are slow, i.e. occur with a low frequency, and the delay of the strobe is adjusted such that reflections have decayed (as can for example be seen in FIG. 8, the reflections are strongest at the beginning of the data eye and then decay). Then, VREF is varied to obtain an upper limit and a lower limit of the data eye. For receivers allowing a calibration of the pullup impedance as described above, VREF may be increased at least almost until the maximum voltage while still ensuring correct data transfer. On the other hand, for receivers which allow only a calibration of the pulldown impedance as described above VREF may be decreased at least almost to the lower limit of the voltage range (i.e. the voltage corresponding to logic zero) while still ensuring correct data transmission. For receivers allowing both calibrations, VREF may be tuned throughout essentially the complete range from logic zero to logic one while still ensuring correct data transmission.

In the example discussed with reference to FIG. 8, VREF and the delay of the strobe signal DQS have been adjusted. In other embodiments, instead of adjusting VREF an amplitude of the data signal, i.e. the voltage range of the data signal, may be adjusted. In still other embodiments, only the reference voltage VREF or only the delay of the data strobe signal are adjusted. For example, if from system design or from other considerations the position of the strongest reflection (arrows 85 and 86 in FIG. 8) are known, no "scanning" of the delay need to be performed, but the delay may be fixedly set to this position such that the signal is sampled in this position, and then VREF adjustments may be used for adjusting the respective transmitter impedance.

As can be seen from the above explanations, a plurality of variations and modifications are possible without departing from the scope of the present invention. Therefore, the scope of the present invention is intended not to be limited by the above embodiments, but is intended to be limited only by the following claims.

What is claimed is:

1. A memory controller, comprising:
a transmitter configured to transmit data to at least one memory component, said transmitter comprising an adjustable impedance, and
said memory controller being configured to transmit test data to said at least one memory component, to vary at least one signal parameter of signals transmitted to said at least one memory component during said transmitting of said test data, to read said test data from said memory component, to compare the read test data with the transmitted test data and to adjust the adjustable impedance based on the result of the comparison.

2. The memory controller of claim 1,
wherein said varying of said at least one signal parameter comprises at least one element of a group consisting of varying a reference voltage, varying a delay of a data strobe signal and varying an amplitude of said test data transmitted.

3. The memory controller of claim 1,
further comprising a control unit configured to cause said memory controller to perform said transmitting of said test data, said varying of said at least one signal parameter and said reading of said test data,
wherein said control unit is selected from a group consisting of a software control unit and a hardware control unit.

4. The memory controller of claim 1,
wherein said varying of at least one signal parameter comprises varying said at least one signal parameter to detect a reflection, and said adjusting of the adjustable impedance comprises adjusting the adjustable impedance to minimize the reflection.

5. The memory controller of claim 3,
wherein said adjustable impedance comprises a pullup impedance and a pulldown impedance, wherein said control unit is configured to first adjust one of said pullup impedance and said pulldown impedance and then to adjust the other one of said pullup impedance and pulldown impedance based on the first adjustment.

6. The memory controller of claim 1, comprising:
a second transmitter configured to transmit a data strobe signal to said at least one memory component, said second transmitter comprising a second adjustable impedance,
wherein said memory controller is configured to adjust said second adjustable impedance based on the adjustment of said adjustable impedance.

7. A method, comprising:
transmitting test data to a memory component,
varying parameters of signals transmitted to the memory component,
reading the test data from the memory component,
comparing the read test data with the transmitted test data, and
adjusting an impedance of a transmitter used for said transmitting based on said comparing.

8. The method of claim 7,
wherein said varying of parameters comprises at least one varying selected from a group consisting of varying a reference voltage transmitted to said memory component, varying a delay of a data strobe signal transmitted to said memory component and varying an amplitude of said test data.

9. The method of claim 7, further comprising:
determining a type of receiver in said memory component, and
performing said varying based on the determined type of receiver.

* * * * *